(12) United States Patent  (10) Patent No.: US 7,489,915 B2
Yamamoto et al.  (45) Date of Patent: Feb. 10, 2009

(54) SQUELCH CIRCUIT AND COMMUNICATION APPARATUS USED WITH THE SAME

(75) Inventors: Tadaoki Yamamoto, Hokkaido (JP); Akira Matsuura, Hokkaido (JP); Koji Takayama, Hokkaido (JP)

(73) Assignee: Sony Corporation (JP)

( * ) Notice: Subject to any disclaimer, the term of this patent is extended or adjusted under 35 U.S.C. 154(b) by 585 days.

(21) Appl. No.: 11/290,487

(22) Filed: Dec. 1, 2005

(65) Prior Publication Data

US 2006/0121866 A1 Jun. 8, 2006

(30) Foreign Application Priority Data

Dec. 7, 2004 (JP) ............... 2004-354201

(51) Int. Cl.
*H04B 1/10* (2006.01)
(52) U.S. Cl. ............. 455/218; 455/212; 455/222; 455/223; 375/217
(58) Field of Classification Search ......... 455/218, 455/212, 222, 223; 375/217
See application file for complete search history.

(56) References Cited

U.S. PATENT DOCUMENTS 5,179,577 A * 1/1993 Ilyadis ............... 375/317
5,436,934 A * 7/1995 Co ..................... 375/351
6,259,904 B1 * 7/2001 Branner et al. ........ 455/212

FOREIGN PATENT DOCUMENTS

JP 02-095030 4/1990

* cited by examiner

*Primary Examiner*—Sanh D Phu
(74) *Attorney, Agent, or Firm*—Rader Fishman & Grauer PLLC; Ronald P. Kananen

(57) ABSTRACT

A squelch circuit and a communication apparatus used with the same that are able to generate a squelch signal even if a squelch period is short and an operation of a squelch detecting circuit is insufficient, the circuit having: a squelch detecting circuit detecting the existence of a signal on a communication line in response to a transmission signal or a received signal and generating a first squelch signal; and a squelch control circuit generating a squelch mask signal in response to the first squelch signal and a transmission control signal and generating a second squelch signal based on the squelch mask signal and the control signal. The first squelch signal is controlled by the transmission signal to generate the second squelch signal in which the lacked portion of the first squelch signal is temporally restructured.

13 Claims, 10 Drawing Sheets

FIG. 6A DP/DM/RXDT
FIG. 6B SQUELCH (IDEAL)
FIG. 6C SQUELCH 1 (REAL)
FIG. 6D XHSOEN/TXVALID
FIG. 6E SQUELCH (MASK)
FIG. 6F SQUELCH 2

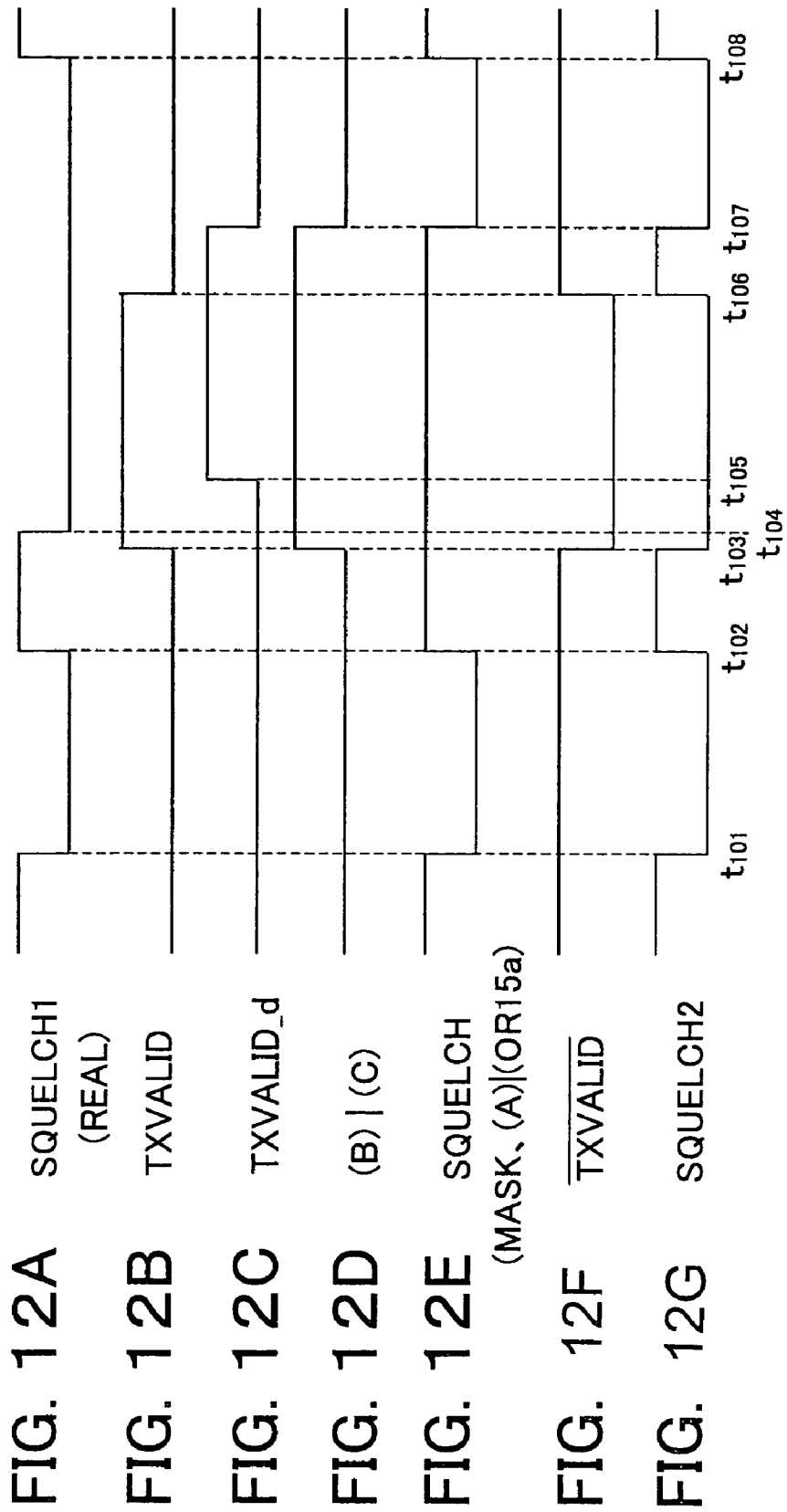

SQUELCH CIRCUIT AND COMMUNICATION APPARATUS USED WITH THE SAME

CROSS REFERENCES TO RELATED APPLICATIONS

The present invention contains subject matter related to Japanese Patent Application JP 2004-354201 filed in the Japanese Patent Office n Dec. 7, 2004, the entire contents of which are incorporated herein by reference.

BACKGROUND OF THE INVENTION

1. Field of the Invention

The present invention relates to a squelch circuit and a communication apparatus used with the same having low power consumption in a squelch detecting circuit and preventing a lack of a squelch signal by using a transmission control signal, in the case where analog operating characteristics of the squelch detecting circuit are insufficient at detecting the existence of a signal on the communication line or where power consumption causes disadvantages in the squelch detecting circuit.

2. Description of the Related Art

In a circuit on a communication apparatus, it is known that the apparatus is applied with a squelch detecting circuit for generating a squelch signal, indicating the existence of a signal on a communication line, and the generated squelch signal is applied to a communication control circuit to control a transmission or a reception operation.

FIG. 1 is a view showing a block diagram of a communication apparatus 200 having a squelch detecting circuit 203 in related art. A main portion according to the squelch circuit in the communication apparatus 200 of FIG. 1 is provided with an input-output control unit 201, a communication control unit 202, and a squelch detecting circuit 203.

A transmission data line and the like are provided from the communication control unit 202 to the input-output control unit 201, and a transmission control signal and data are transmitted. On the other hand, a received data line is provided from the input-output control unit 210 to the communication control unit 202, and received data and a reception control signal are received.

A communication line (or wireless) is provided from the input-output control unit 201 to an external apparatus, and is connected to the squelch detecting circuit 203. An output terminal of the received data line is also connected to the squelch detecting circuit 203, and an output terminal of the squelch detecting circuit 203 is connected to the communication control unit 202.

The squelch detecting circuit 203 generates the squelch signal by applying a signal on the communication line or a data on the received data line between the communication control unit 202 and the input-output control unit 201.

The communication control unit 202 controls the whole communication, and the input-output control unit 201 controls the input and output operations of the communication apparatus.

FIGS. 2A to 2C are views showing a timing chart in the block diagram of the communication apparatus 200 in related art, shown in FIG. 1. In the communication line, a period from t201 to t203 indicates a receiving period, and a period from 205 to t207 indicates a transmitting period. Also, a period from t208 to t210 indicates the receiving period. An ideal squelch signal is shown in FIG. 2B. A communication line (or received data line) shown in FIG. 2A is in a high level in a period from an end time of the receiving period t203 to a start time of the transmitting period t205. And in the same way, it is also in a high level in a period from the end time of the transmitting period t207 to the start time of the receiving period 208, so the squelch signal is generated. In other receiving periods, periods from t202 to t203 and from t208 to t210, and another transmitting period, a period from t206 to t207, the communication line is in a low level, so the squelch signal is not generated. Here, the drawing shows an example in which a squelch control period from t207 to t208 is shorter than that from t203 to t205 in a period except the transmitting period or the receiving period.

In comparison with an ideal squelch signal with ideal transmitting and receiving periods on a communication line or the received data line, a real squelch signal shown in FIG. 2C delays an assert and deassert timings due to analog delay characteristics of the squelch detecting circuit 203 in the period from t203 to t204 (b). Further, in the squelch detecting circuit 203 in which the analog operating characteristics are insufficient, it suffers from the disadvantage that the lack of the squelch signal is generated in the period from t208 to t209 (a) in the case where the duration between the transmission period and the reception period (from t203 to t204) is short. In related art, the current is increased to improve the analog operating characteristics of the squelch detecting circuit 203, and consequently, the delay value of the squelch signal is reduced. However, the amount of current is raised by increasing the frequency to be applied, and as a result, power consumption is further increased.

The above is disclosed, for example, in Japanese Unexamined Patent Publication (Kokai) No. 2-95030.

SUMMARY OF THE INVENTION

The present invention is to provide a squelch circuit for controlling a squelch signal by using a small scale circuit, without increasing the power consumption, and for improving the analog operating characteristics of the squelch detecting circuit.

The present invention is also to provide a communication apparatus including a squelch control circuit applied with a transmission control signal for controlling the squelch signal, generated in the squelch detecting circuit.

The squelch control circuit is provided with a function for masking and controlling the squelch signal in the transmitting period and a function for temporary generating the squelch signal indicating the transmitting period from the transmitting control signal.

According to an embodiment of the present invention, there is provided a squelch circuit having: a squelch detecting circuit detecting the existence of a signal on a communication line in response to a transmission signal or a received signal and generating a first squelch signal; and a squelch control circuit generating a squelch mask signal in response to the first squelch signal and a transmission control signal, and generating a second squelch signal based on the squelch mask signal and the control signal.

According to an embodiment of the present invention, there is provided a communication apparatus having: a communication control unit having a transmission data line or a received data line, and transmitting a data and a transmission control signal; an input and output control unit transmitting a transmission data or a received data to the communication control unit, and outputting a data to a communication line; a squelch detecting circuit generating a first squelch signal indicating the existence of a signal on the communication line in response to a data from the communication line and a data from the reception line; and a squelch control circuit generating a second squelch signal based on the transmission control signal and the first squelch signal, and supplying the second squelch signal to the communication control unit.

According to an embodiment of the present invention, there is provided a communication apparatus having: a serializer and deserializer unit having a transmission data line or a received data line, and transmitting a data and a transmission control signal; a transceiver unit transmitting a transmission data or a received data to the serializer and deserializer unit, and outputting a data to a communication line; a squelch detecting circuit generating a first squelch signal indicating the existence of a signal on the communication line in response to a data from the communication line and a data from the reception line; and a squelch control circuit generating a second squelch signal based on the transmission control signal, the first squelch signal, and a transmission valid control signal supplied to the serializer and deserializer unit, and supplying the second squelch signal to the serializer and deserializer unit.

The squelch circuit and the communication apparatus used with the same according to the present invention can generate a signal in which the squelch signal with a lacked portion between a transmitting period and a receiving period is reconstructed by applying a transmission signal. By providing the squelch control circuit, it is possible to suppress an increase of a current for improving the analog operating characteristic of the squelch detecting circuit, and it is possible to realize low power consumption. Also, by reducing the fluctuation of the delay value of the squelch signal caused by a fluctuation of the analog operating characteristic of the squelch detecting circuit, it is easy to realize a reduction in the cost of production and an increase of the yield ratio.

BRIEF DESCRIPTION OF THE DRAWINGS

These and other features of the present invention will be apparent in more detail with reference to the accompanying drawings, in which:

FIGS. 12A to 12G are timing charts for explaining an operation of the third and the fourth squelch control circuits shown in FIG. 10 and FIG. 11.

DESCRIPTION OF THE PREFERRED EMBODIMENTS

Preferred embodiments of the present invention will be described with reference to the drawings.

In a squelch circuit including a squelch detecting circuit and a squelch control circuit, and a communication apparatus used with the same, a main portion concerning a squelch control will be shown with reference to the drawings.

Figure 3:
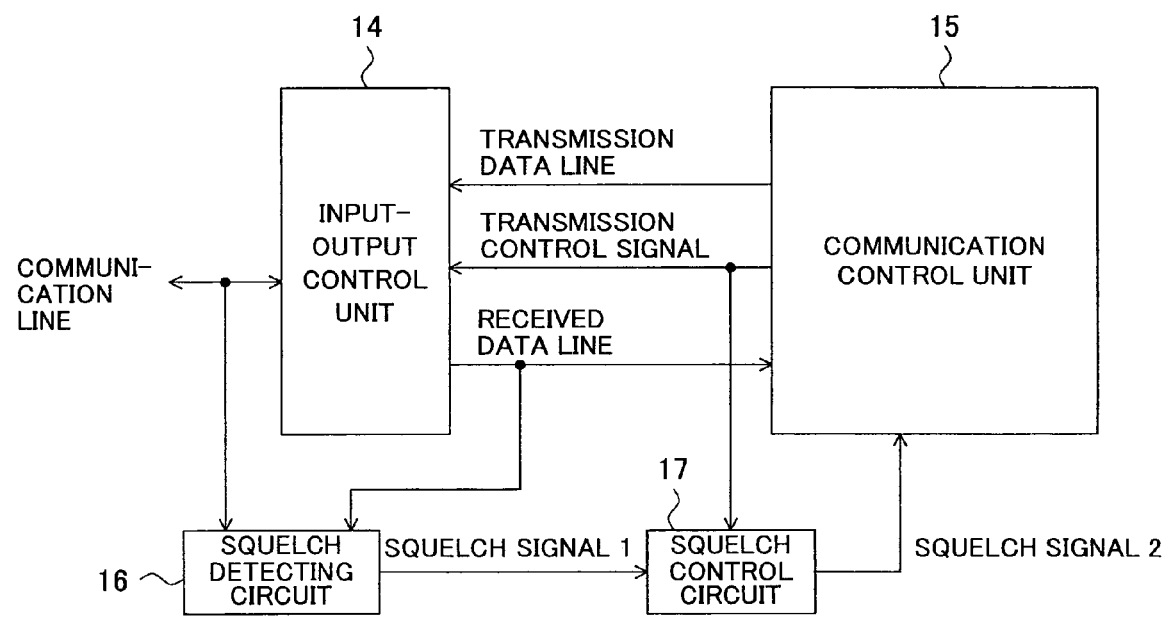
FIG. 3 is a block diagram of a configuration of a communication apparatus having a squelch circuit according to the present invention.

FIG. 3 is a block diagram showing a configuration of an example of a communication apparatus 10 having a squelch circuit according to the present embodiment.

The configuration of the communication apparatus 10, shown in the block diagram in FIG. 3, is provided with a communication control unit 15, an input-output control unit 14, a squelch detecting circuit 16 and a squelch control circuit 17.

The communication control unit 15 controls the whole communication, the input-output control unit 14 controls input and output operations of communication data in a communication line and the communication control unit 15, the squelch detecting circuit 16 detects an existence of the communication data on the communication line and generates a squelch signal 1, and the squelch control circuit 17 restructures a lacked portion of the squelch signal.

A transmission data line is provided from the communication control unit 15 to the input-output control unit 14, and a transmission control signal and the transmission data are transmitted. On the other hand, a received data line is provided from the input-output control unit 14 to the communication control unit 15, and a reception control signal and received data are received.

A communication line (or wireless) is provided from the input-output control unit 14 to an external apparatus, and it is connected to the squelch detecting circuit 16.

An output terminal of the received data line is also is connected to the squelch detecting circuit 16, and an output terminal of the squelch detecting circuit 16 is connected to the squelch control unit 17. The squelch control circuit 17 receives the transmission control signal. The output terminal of the squelch control circuit 17 is connected to the communication control unit 15. And, the squelch control circuit 17 supplies the squelch signal 2.

The squelch detecting circuit 16 is supplied with a signal on the communication line and a signal from the received data line. The squelch detecting circuit 16 detects a squelch period indicating the existence of the data on the communication line, and generates the squelch signal 1. The squelch control circuit 17 is supplied with the squelch signal 1 outputted from the squelch detecting circuit 16 and a transmission control signal outputted from the communication control unit 15 to generate a squelch mask signal. The squelch control circuit 17 generates a squelch signal 2 by applying the squelch mask signal, and outputs the same to the communication control unit 15.

In the case of transmitting data, the transmission control signal is supplied from the communication control unit 15 to the input-output control unit 14. Data is transmitted through the transmission data line in response to the transmission control signal.

Then, the data is transmitted through the communication line to an external communication apparatus. In the above case, a control signal or data, indicating that the data is communicated, is supplied from the communication line to the squelch detecting circuit 16. Due to this signal, the squelch signal is not detected in the communication.

Namely, in a period in which the data is outputted from the input-output control unit 14 through the communication line to the external apparatus, the squelch signal is not generated in the squelch detecting circuit 16. And, in the squelch control circuit 17, the squelch signal is not input; consequently, a signal corresponding to the squelch signal 2 is not generated.

On the other hand, in the case of receiving the data, the data is supplied from the external apparatus through the communication line to the input-output control unit 14. Simultaneously, the received data is transmitted from the received data line to the squelch detecting circuit 16. Further, the squelch detecting circuit 16 is supplied with an input data or its control signal; however, the squelch signal is not detected due to the existence of the input data and the like, and the squelch signal 1 is not generated.

And, the squelch signal 1 is not generated in the squelch detecting circuit 16, so the squelch signal 2 is not also generated in the squelch control circuit 17 of the next stage.

Namely, in a period receiving the data from the external apparatus, the squelch signal 1 is not detected, and the squelch signal 2 is not also generated along the above.

Then, in a period from an end of the receiving period to a start of the transmitting period (a period from t2 to t4 in FIGS. 4A to 4F) or a period from the end of the transmitting period to the start of the receiving period (a period from t6 to t7 in FIGS. 4A to 4F), the transmission data or the received data is not input to the squelch detecting circuit 16 and the data is not input from the received data line. The squelch detecting circuit 16 detects that it is in a squelch period, and the squelch signal 1 is generated.

In the case where the squelch period is longer than a response period of the squelch detecting circuit 16 which corresponds to the period from t2 to t4 in FIGS. 4A to 4F, the squelch signal 1 can be generated.

However, in the case where the squelch period is short, so the squelch detecting circuit 16 responds insufficiently which corresponds to the period from t6 to t7 in FIGS. 4A to 4F, the squelch signal 1 is not able to be generated and is lacked.

The transmission control signal is supplied to the squelch control circuit 17 to generate a signal in which the squelch signal is masked in the transmitting period.

Further, the squelch signal masked in the transmitting period is applied with the transmission control signal to mask the squelch signal temporally in the transmitting period. The masked signal is performed with a logical-operation based on the transmission control signal to generate the squelch signal 2 in which the lacked portion between the transmitting period and the receiving period is restructured. So, the restructured squelch signal 2 is supplied to the communication control unit 15.

A feature of the communication apparatus 10 is its generation of the controlled squelch signal 2 by applying the squelch signal 1 generated in the squelch detecting circuit 16 and the transmission control signal in the squelch control circuit 17. Therefore, it is possible to generate the squelch signal 2 in which a lacked portion of the squelch signal 1 generated in the squelch detecting circuit 16 is restructured.

Figure 1:
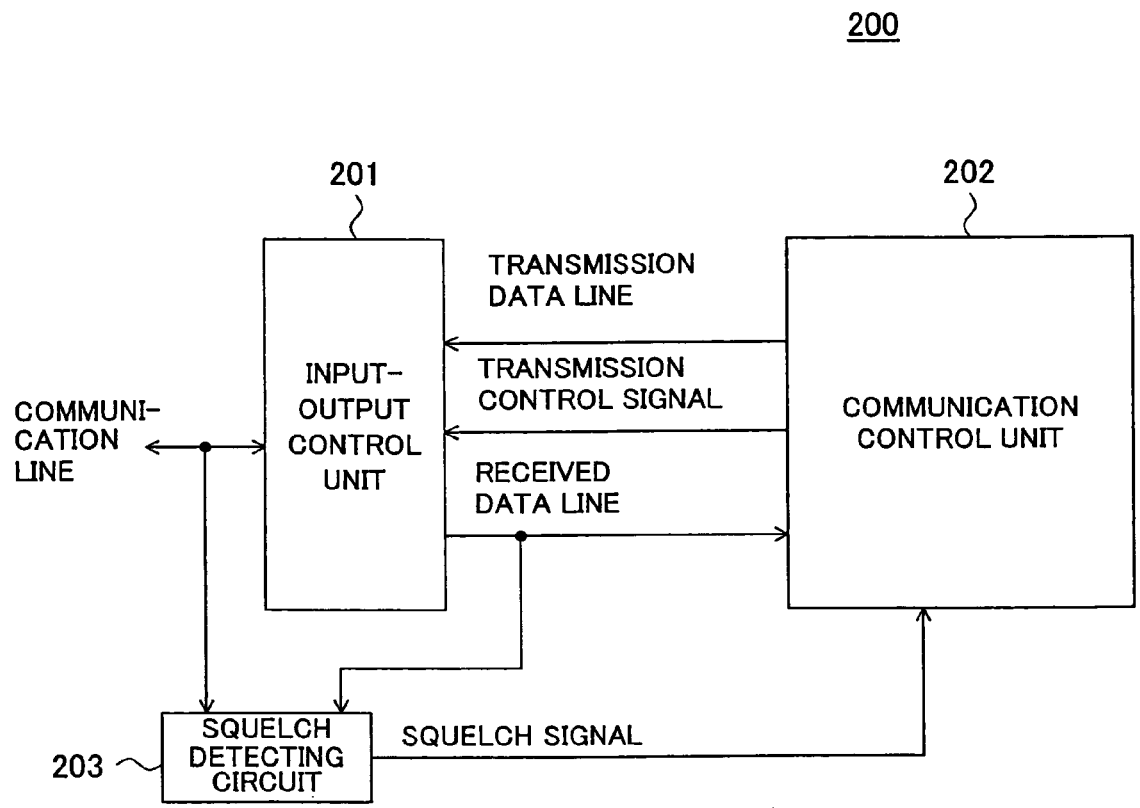
FIG. 1 is a block diagram of a configuration of a communication apparatus in related art.
Figure 2:
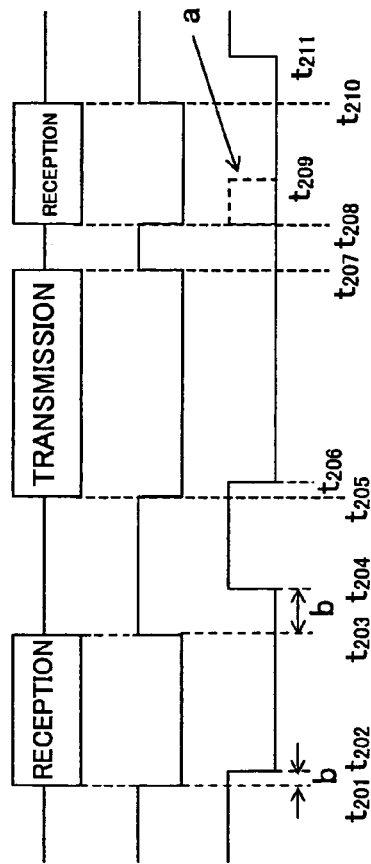
FIGS. 2A to 2C are timing charts for explaining an operation of the communication apparatus in the related art shown in FIG. 1.

Hereinafter, an operation of the communication apparatus used with the squelch circuit shown in FIG. 1 will be described in detail with reference to a timing chart of FIGS. 4A to 4E.

Figure 4:
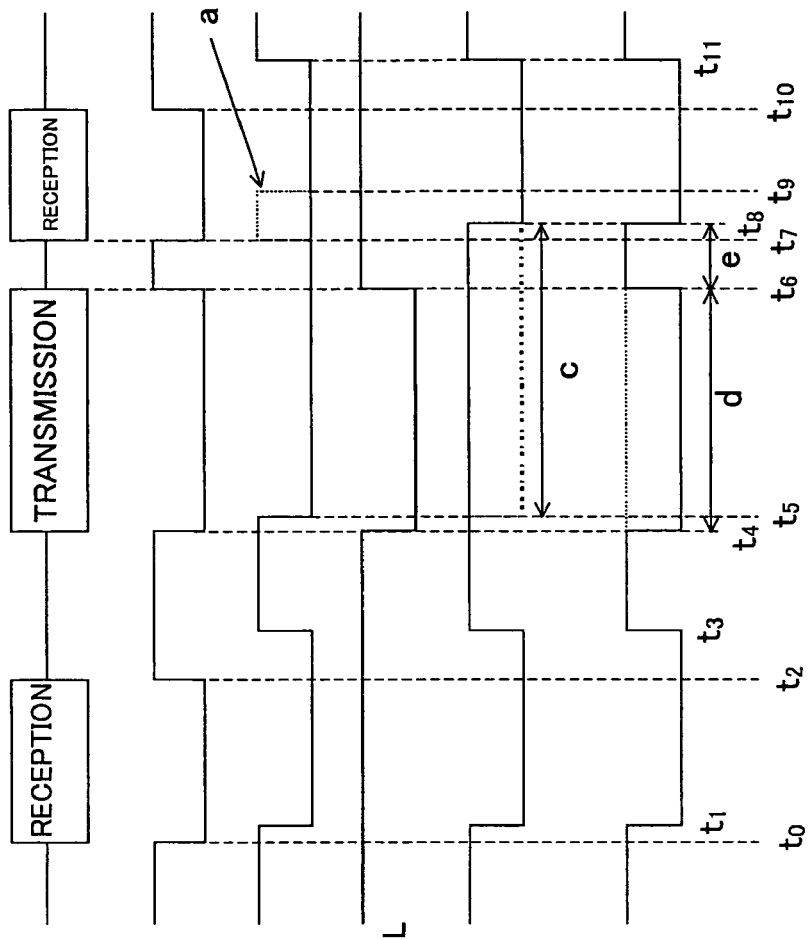
FIGS. 4A to 4F are timing charts for explaining an operation of the communication apparatus shown in FIG. 3.

As shown in FIG. 4E, the squelch signal (masked) is maintained in a high level from the end of the squelch signal 1 t5 to the reception start t8 which does not depend on the duration of a general squelch period. By applying a signal on the communication line or a signal or both signals shown in FIG. 4A, a squelch signal 1 which is lacked between the transmitting period and the receiving period (a in FIG. 4C) is input to the squelch control circuit 17.

The squelch control circuit 17 generates a signal masked with the squelch signal (c) in the transmitting period (FIG. 4E) by applying the transmission control signal (FIG. 4D). Then, the squelch signal masked in the transmitting period (FIG. 4E) is performed with an AND logical operation by applying the transmission control signal to mask the squelch signal temporarily in the transmitting period (d). So the squelch signal 2 (FIG. 4F) is generated in which the squelch signal of the lacked portion between the transmitting period and the receiving period (a signal corresponding to in FIG. 4C) is restructured (e).

The squelch signal 2 generated in the squelch control circuit 17 is used in the communication control unit 15, so it is possible to manage and control the communication status accuracy.

When the mask operation is performed by applying the transmission control signal or the AND logical operation of the squelch signal temporally, the squelch control circuit 17 generates a control signal delayed in phase from the transmission control signal, for example, by using a clock or a delay buffer circuit. So, it is possible to control the squelch signal by applying the above signals.

Figure 5:
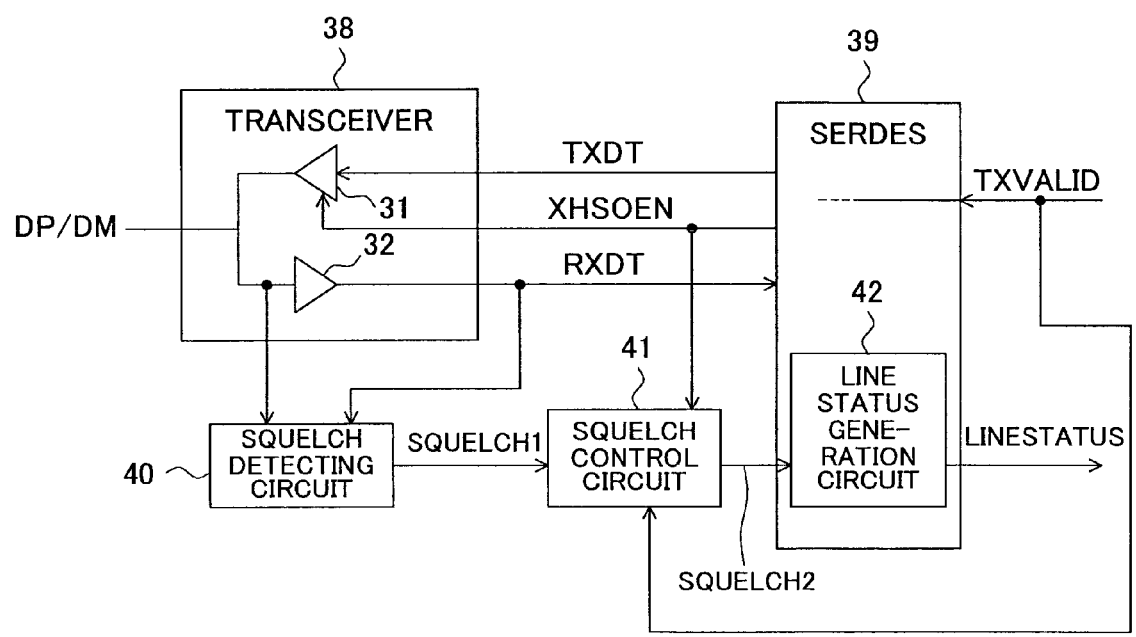
FIG. 5 is a block diagram of an USB communication apparatus.

Next, another embodiment, FIG. 5 shows a circuit diagram of a communication apparatus with an universal serial bus (USB).

The USB communication apparatus 30 shown in FIG. 5 is provided with a transceiver unit 38, a serializer-deserializer (SERDES) unit 39, a squelch detecting circuit 40, a squelch control circuit 41 and a line state generation circuit 42.

The transceiver unit 38 controls input and output operations of an USB communication DP/DM line, the serializer-deserializer (SERDES) unit 39 controls serial-parallel conversion of the transmission signal and a line-state signal indicating a state on the DP/DM line, the squelch detecting circuit 40 detects the existence of the USB communication line, the squelch control circuit 41 controls the squelch signal generated in the squelch detecting circuit 40, and the line-state generation circuit 42 generates the line-state signal from the squelch signal.

A transmission valid (TXVALID) signal is supplied to an input terminal of the SERDES unit 39, and an output terminal thereof is connected to a transmission unit (transmission buffer) 31 of the transceiver 38 to transmit transmission data (TXDT). And the transmission unit 31 is controlled by a (transmission) control signal XHSOEN outputted from the SERDES unit 39. The transmission data is outputted to the communication DP/DM line from the transmission unit 31 in response to the control signal XHSOEN.

The communication DP/DM line is connected to a reception unit (reception buffer) 32 of the transceiver 38 and also to the squelch detecting circuit 40, and supplies an input data. From the output terminal of the reception unit 32, the received data (RXDT) is supplied to the SERDES unit 39 and also to the squelch detecting circuit 40. The output terminal of the squelch detecting circuit 40 is connected to an input terminal of the squelch control circuit 41, and a squelch signal 1 is supplied.

The squelch control circuit 41 is supplied with the squelch signal (SQUELCH) 1, a communication control signal outputted from the SERDES unit 39, and the TXVALID signal supplied to the input terminal of the SERDES unit 39. The squelch control circuit 41 is supplied with the squelch signal 2 in which a lacked portion of the squelch signal 1 is restructured. And the squelch signal 2 is supplied to the line state generation circuit 42 provided with the SERDES unit 39. The line state generation circuit 42 outputs the line state signal indicating a state of the communication line in response to the squelch signal 2.

Figure 6:
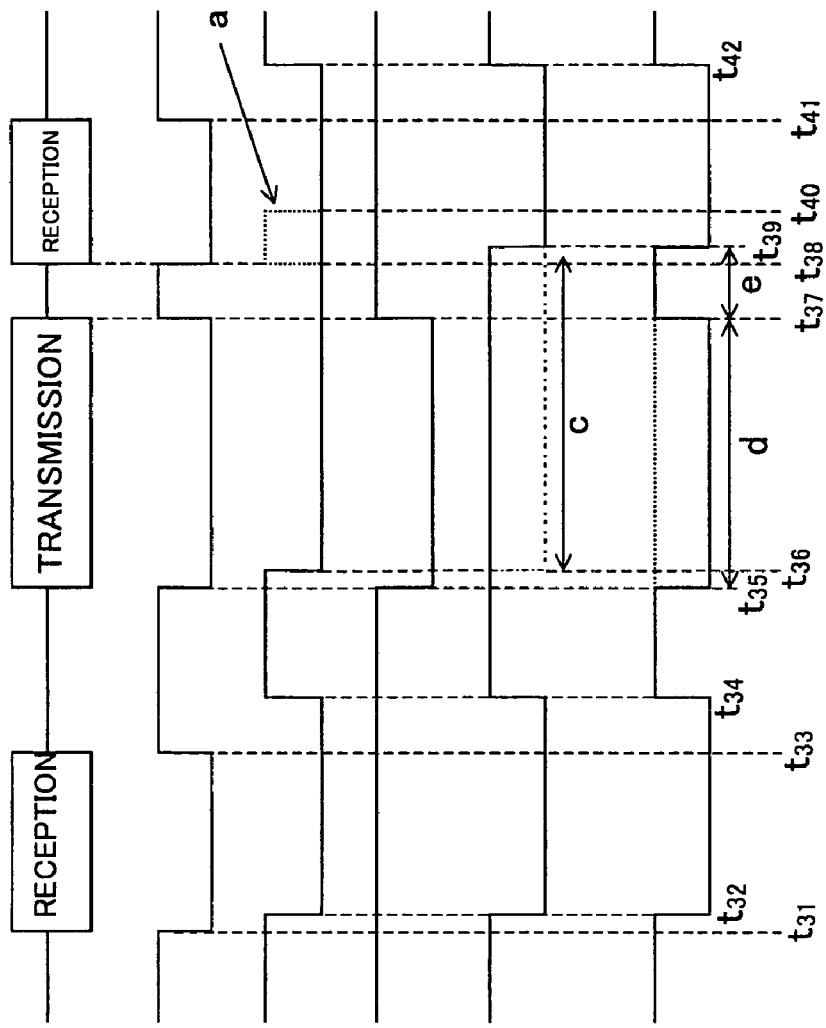
FIGS. 6A to 6F are timing charts for explaining an operation of the USB communication apparatus shown in FIG. 5.

An operation of the USB as an example of the communication apparatus 30 of the present embodiment will be described with reference to a block diagram of FIG. 5 and a timing chart of FIG. 6. As a method of controlling a communication apparatus with the USB in the present embodiment, by applying a signal in the DP/DM line (FIG. 6A) or the RXDT signal or both signals, the squelch signal 1 (FIG. 6C) with the lacked portion (a) from the squelch detecting circuit 40 is input to the squelch control circuit 41.

By applying the XHSOEN signal (FIG. 6D) applied for an enable control of the transmission buffer 31 of the transceiver unit 38 or the TXVALID signal (FIG. 6D) for the transmission defined by the USB 2.0 transceiver macrocell interface (UTMI) standard, or both signals, squelch control circuit 41 generates a signal (FIG. 6E) in which the squelch signal is masked in the transmitting period.

Further, the signal in which the squelch signal is masked in the transmitting period is performed with the AND logical processing by applying the XHSOEN signal or the TXVALID signal to mask the squelch signal (d) temporally in the transmitting period. And, it generates the squelch signal 2 (FIG. 6F).

The lacked portion of the squelch signal 1 between the transmitting period and the receiving period (a) is restructured.

The squelch signal 2 generated in the squelch control circuit 41 is applied in the line state generation circuit 42 inside the SERDES unit 39. So, the line state signal can be generated, and the inside of the SERDES unit 39 can be managed and controlled accurately.

Next, an embodiment of the squelch control circuit 41 will be described.

Figure 7:
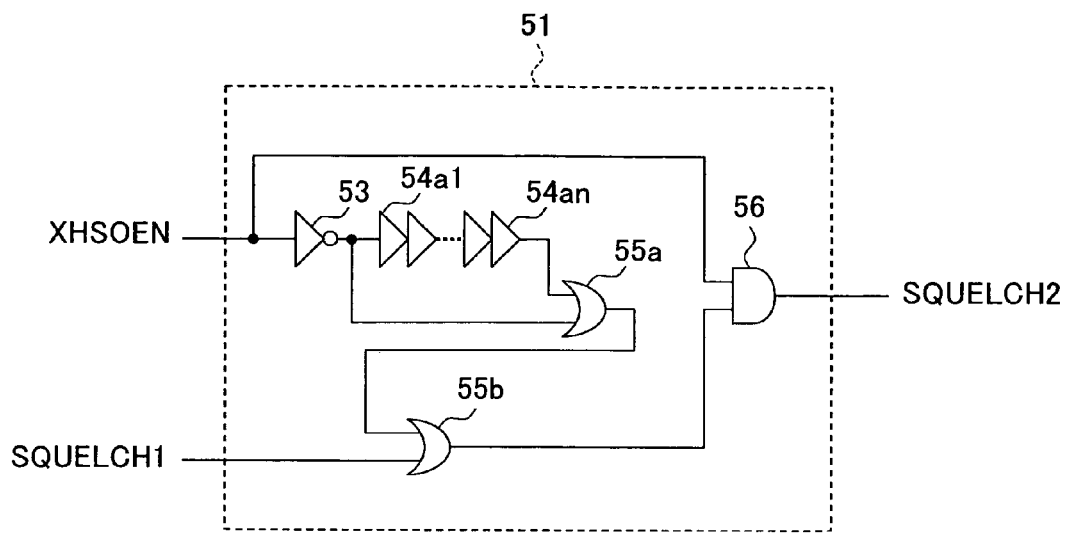
FIG. 7 is a circuit diagram of a first squelch control circuit used in the USB communication apparatus shown in FIG. 5.

FIG. 7 shows a circuit diagram of a squelch control circuit 50 as an example of a configuration of the USB in the communication apparatus. The squelch control circuit 50 is provided with an inverter circuit 53, delay buffer circuits 54a1, ..., 54an, OR circuit 55a, OR circuit 55b, and an AND circuit 56.

The inverter circuit 53 generates an inverted signal of the XHSOEN signal, the delay buffer circuits 54a1, ..., 54an delay the inverted signal, the OR circuit 55a is supplied with the inverted signal and a delayed signal, the OR circuit 55b is supplied with the squelch signal 1 from the squelch detecting circuit and a signal generated in the OR circuit 55a, and the AND circuit 56 is supplied with a signal generated in the OR circuit 55b and the XHSOEN signal.

Figure 8:
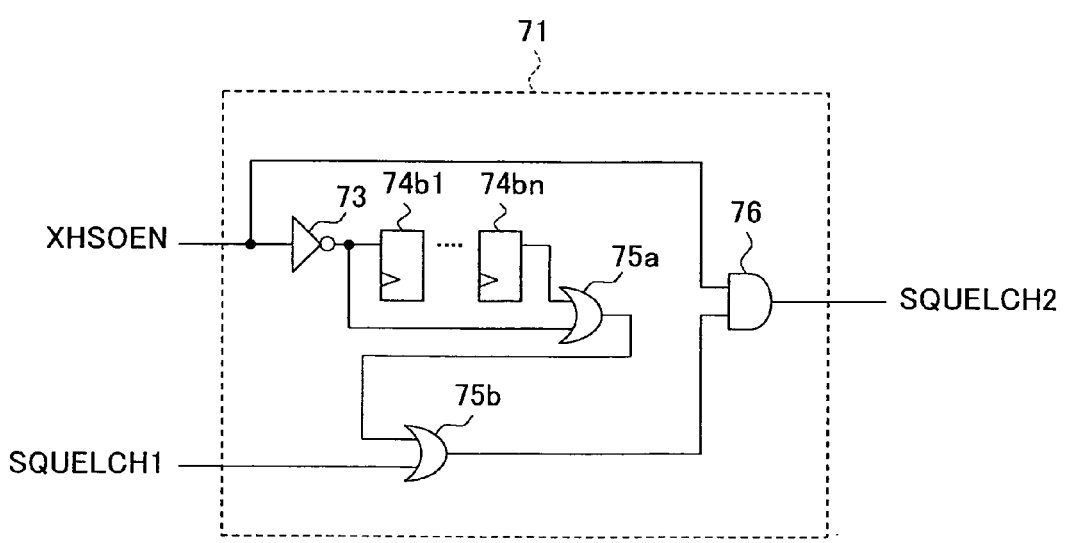
FIG. 8 is a circuit diagram of a second squelch control circuit used in the USB communication apparatus shown in FIG. 5.

As another example, FIG. 8 shows a circuit diagram of a squelch control circuit 70 used in the communication apparatus of the USB.

The squelch control circuit 70 shown in FIG. 8 is provided with an inverter circuit 73, flip-flop circuits 74b1, ..., 74bn, an OR circuit 75a, an OR circuit 75b, and an AND circuit 76.

The inverter circuit 73 generates the inverted signal of the XHSOEN signal, the flip-flop circuits 74b1, ..., 74bn delay the inverted signal, the OR circuit 75a is supplied with the inverted signal and the delayed signal, and the OR circuit 75b is supplied with the squelch signal 1 from the squelch detecting circuit and a signal generated in the OR circuit 45a, and the AND circuit 76 is supplied with a signal generated in the OR circuit 75b and the XHSOEN signal.

The squelch control circuit 70 is different from the squelch control circuit 50 shown in FIG. 7 in terms of the configuration of a delay circuit. And, it has a circuit configuration in which the flip-flop circuits 74b1, ..., 74bn replace the delay buffer circuits 54a1, ..., 54an in FIG. 7. However, the flip-flop circuits 74b1, ..., 74bn and the delay buffer circuits 54a1, 54an are used for delaying the inverted signal of the XHSOEN signal, and the circuit functions thereof are the same.

Figure 9:
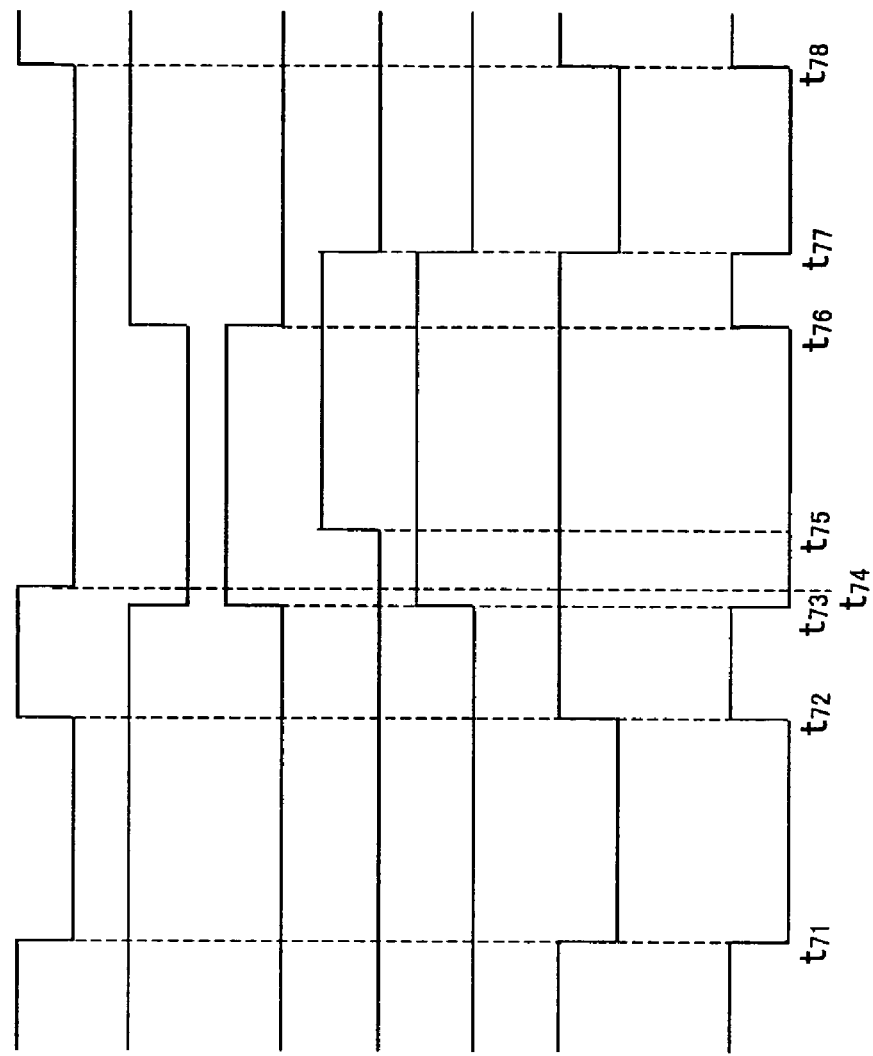
FIGS. 9A to 9G are timing charts for explaining an operation of the first and the second squelch control circuits shown in FIG. 7 and FIG. 8.

Next, operations of the squelch control circuits 50 and 70 will be described. The squelch control circuits 50 and 70 have different delay circuits respectively, however, the functions are the same, as described above. So the description will be given with reference to the block diagrams of FIG. 7 and FIG. 8 and a timing chart of FIG. 9.

As a method of controlling the squelch control circuits 50 and 70, the XHSOEN signal is input to the inverter circuit 53 (73) to generate the inverted signal (FIG. 9C). The inverted signal is input to the delay buffer circuits 54a1, ..., 53an, or the flip-flop circuits 74b1, ..., 74bn to generate the delayed signal XHSOEN_d (FIG. 9D). In the above case, the number of circuit stages of the delay buffer circuits or the flip-flop circuits are determined depending on the delay characteristics of the squelch detecting circuit 40. The inverted signal and the delayed signal XHSOEN_d are input to the OR circuit 55a (75a) to generate a signal for masking (FIG. 9E).

The signal for masking and the squelch signal 1 from the squelch detecting circuit 40 are input to the OR circuit 55b (75b) to generate a signal in which the squelch signal is masked in the transmitting period (FIG. 9F). The generated signal and the XHSOEN signal are input to the AND circuit 56 (76), which generates the squelch signal 2 in which the squelch signal of the lacked portion between the transmitting period and the receiving period is restructured, for example, a waveform from t76 to t77 in FIG. 9G.

Figure 10:
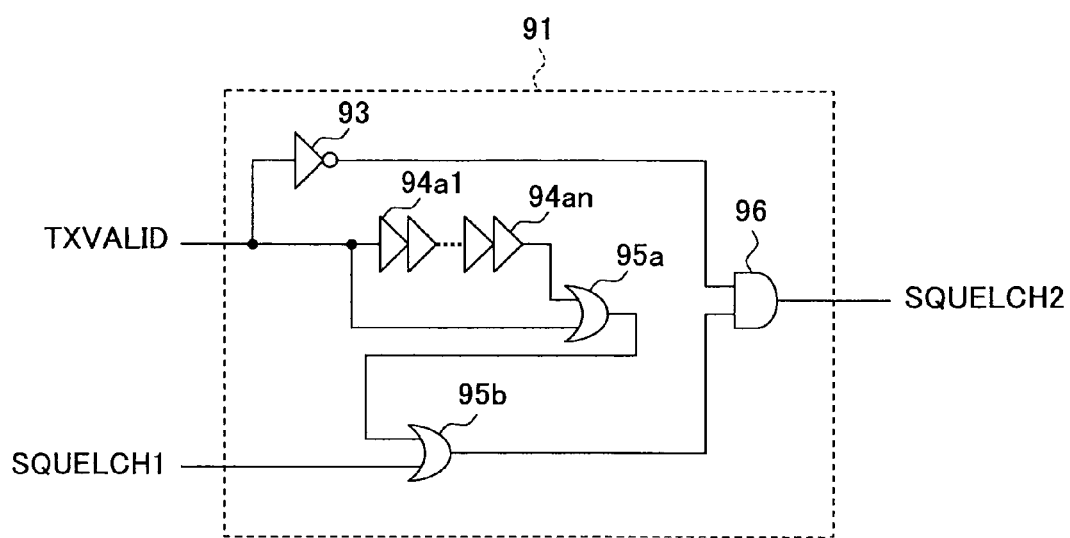
FIG. 10 is a circuit diagram of a third squelch control circuit used in the USB communication apparatus shown in FIG. 5.

Next, as another embodiment, FIG. 10 shows a circuit diagram of a squelch control circuit 90 used in the communication apparatus with the USB.

The squelch control circuit 90 shown in FIG. 10 is provided with an inverter circuit 93, delay buffer circuits 94a1, ..., 94an, an OR circuit 95a, an OR circuit 95b, and an AND circuit 96.

The inverter circuit 93 generates an inverted signal of the TXVALID signal, the delay buffer circuits 94a1, ..., 94an delay the TXVALID signal, the OR circuit 95a is supplied with the TXVALID signal and a delayed signal, the OR circuit 95b is supplied with the squelch signal 1 from the squelch detecting circuit 40 and a signal generated in the OR circuit 95a, and the AND circuit 96 is supplied with a signal generated in the OR circuit 95b and the inverted signal of the XHSOEN signal.

Figure 11:
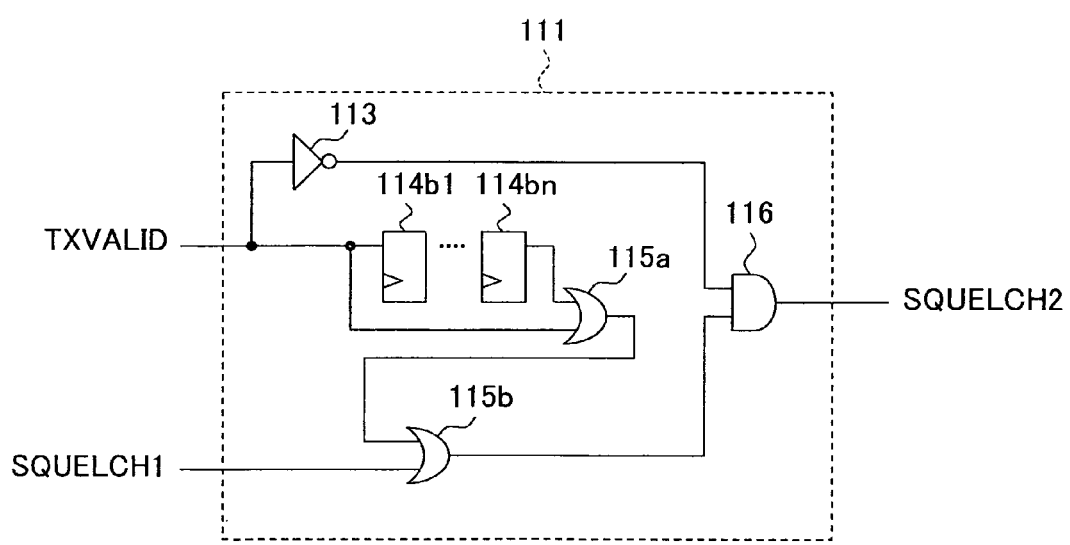
FIG. 11 is a circuit diagram of a fourth squelch control circuit used in the USB communication apparatus shown in FIG. 5.

Further, as another example, FIG. 11 shows a circuit diagram of a squelch control circuit 110 used in the communication apparatus with the USB.

The squelch control circuit 110 shown in FIG. 11 is provided with an inverter circuit 113, flip-flop circuits 114b1, ..., 114bn, an OR circuit 115a, an OR circuit 115b, and an AND circuit 116.

The inverter circuit 113 generates the inverted signal of the TXVALID signal, flip-flop circuits 114b1, ..., 114bn delay the TXVALID signal, the OR circuit 115a is supplied with the TXVALID signal and the delayed signal, the OR circuit 115b is supplied with the squelch signal 1 from the squelch detecting circuit 40 and a signal generated in the OR circuit 115a, and the AND circuit 116 is supplied with a signal generated in the OR circuit 115b and the TXVALID signal.

The squelch control circuit 110 is different from the squelch control circuit 90 shown in FIG. 10 in terms of a circuit configuration for delaying the TXVALID signal. And it has a circuit configuration in which the flip-flop circuits 114b1, ..., 114bn replace the delayed buffer circuits 94a1, ..., 94an. However, the flip-flop circuits 114b1, ..., 114bn and the delay buffer circuits 94a1, ..., 94an are used for delaying the inverted signal of the TXVALID signal, and the circuit functions thereof are the same. Next, operations of the squelch control circuits 90 and 110 shown in FIG. 10 and FIG. 11 will be described. The squelch control circuits 90 and 110 have a different circuit configuration in terms of the delay circuit however, these functions are the same. So the description will be given with reference to the block diagrams of FIG. 10 and FIG. 11 and a timing chart of FIG. 12.

As a control operation of the squelch control circuits 90 and 110, the TXVALID signal is input to the delay buffer circuits 94a1, ..., 94an or the flip-flop circuits 114b1, ..., 74bn to generate the delayed signal TXVALID_d (FIG. 12C). In the above case, the number of circuit stages of the delay buffer circuits or the flip-flop circuits are determined depending on the delay characteristics of the squelch detecting circuit 40.

The TXVALID signal and the delayed signal TXVALID_d are input to the OR circuit 95a (115a) to generate a signal for masking (FIG. 12D). The signal for masking and the squelch signal 1 from the squelch detecting circuit 40 are input to the OR circuit 95b (115b) to generate a signal. The squelch signal is masked in the transmitting period (FIG. 12E).

The TXVALID signal is also input to the inverter circuit 93 (113) to generate the inverted signal (FIG. 12F). The inverted signal and the signal in which the squelch signal is masked in the transmitting period are input to the AND circuit 96 (116). The AND circuit 96(116) generates the squelch signal 2 in which the squelch signal of the lacked portion between the transmitting period and the receiving period is restructured (FIG. 12G).

In this way, in the communication apparatus described above, it is possible to generate a signal in which a lacked portion between the transmitting period and the receiving period is restructured by applying the transmission control signal.

And, by adding the squelch control circuit, it is possible to suppress an increase of current, improve the analog operating characteristics of the squelch detecting circuit, and enable a low power consumption.

Further, a fluctuation of a delaying value of the squelch signal, which is caused by a dispersion of the analog operating characteristics of the squelch detecting circuit in producing, is reduced. So, a reduction in the production cost and an increase of the yield ratio can be realized easily.

It should be understood by those skilled in the art that various modifications, combinations, subcombinations and alterations may occur depending on design requirements and other factors in so far as they are within scope of the appended claims or the equivalents thereof.

What is claimed is:

1. A squelch circuit comprising:
    a squelch detecting circuit detecting an existence of a signal on a communication line in response to a transmission signal or a received signal, and generating a first squelch signal; and
    a squelch control circuit generating a squelch mask signal in response to the first squelch signal and a transmission control signal, and generating a second squelch signal based on the squelch mask signal and the control signal.

2. A squelch circuit as set forth in claim 1, wherein the squelch mask signal is generated by applying a delayed signal of the transmission control signal and the first squelch signal.

3. A squelch circuit as set forth in claim 1, wherein the second squelch signal is generated by a logical operation based on the squelch mask signal and the first squelch signal.

4. A squelch circuit as set forth in claim 2, wherein the delayed signal of the transmission control signal is delayed by a delaying circuit.

5. A communication apparatus comprising:
    a communication control unit having a transmission data line or a received data line, and transmitting a data and a transmission control signal;
    an input and output control unit transmitting a transmission data or a received data to the communication control unit, and outputting a data to a communication line;
    a squelch detecting circuit generating a first squelch signal indicating an existence of a signal on the communication line in response to a data from the communication line and a data from the reception line; and
    a squelch control circuit generating a second squelch signal based on the transmission control signal and the first squelch signal, and supplying the second squelch signal to the communication control unit.

6. A communication apparatus as set forth in claim 5, wherein the squelch control circuit generates a squelch mask signal by a logical operation based on the first squelch signal and the transmission control signal, and generates the second squelch signal based on the squelch mask signal and the transmission control signal.

7. A communication apparatus as set forth in claim 6, wherein the squelch mask signal is generated by applying a delayed signal of the transmission control signal and the first squelch signal.

8. A communication apparatus as set forth in claim 6, wherein the second squelch signal is generated by a logical operation based on the squelch mask signal and the first squelch signal.

9. A communication apparatus as set forth in claim 6, wherein the delayed signal of the transmission control signal is delayed by using a delaying unit.

10. A communication apparatus comprising:
    a serializer and deserializer unit having a transmission data line or a received data line, and transmitting a data and a transmission control signal;
    a transceiver unit transmitting a transmission data or a received data to the serializer and deserializer unit, and outputting a data to a communication line;
    a squelch detecting circuit generating a first squelch signal indicating an existence of a signal on the communication line in response to a data from the communication line and a data from the reception line; and
    a squelch control circuit generating a second squelch signal based on the transmission control signal, the first squelch signal, and a transmission valid control signal supplied to the serializer and deserializer unit, and supplying the second squelch signal to the serializer and deserializer unit.

11. A communication apparatus as set forth in claim 10, wherein the squelch control circuit generates a squelch mask signal by a logical operation based on the first squelch signal and the transmission control signal, and generates the second squelch signal based on the squelch mask signal and the transmission control signal.

12. A communication apparatus as set forth in claim 11, wherein the squelch mask signal is generated by using a delayed signal of the transmission control signal and the first squelch signal.

13. A communication apparatus as set forth in claim 11, wherein the second squelch signal is generated by a logical operation based on the squelch mask signal and the first squelch signal.

* * * * *